(12) United States Patent
Itou et al.

(10) Patent No.: US 11,335,564 B2
(45) Date of Patent: May 17, 2022

(54) ELEMENT CHIP SMOOTHING METHOD AND ELEMENT CHIP MANUFACTURING METHOD

(71) Applicant: Panasonic Intellectual Property Management Co., Ltd., Osaka (JP)

(72) Inventors: Akihiro Itou, Kyoto (JP); Atsushi Harikai, Osaka (JP); Toshiyuki Takasaki, Osaka (JP); Shogo Okita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/993,466

(22) Filed: Aug. 14, 2020

(65) Prior Publication Data
US 2021/0057227 A1  Feb. 25, 2021

(30) Foreign Application Priority Data
Aug. 23, 2019  (JP) .............................. JP2019-152966

(51) Int. Cl.
*H01L 21/3065*  (2006.01)
*H01L 21/02*  (2006.01)

(52) U.S. Cl.
CPC .... *H01L 21/3065* (2013.01); *H01L 21/02002* (2013.01); *H01L 21/02087* (2013.01); *H01L 21/02252* (2013.01)

(58) Field of Classification Search
None
See application file for complete search history.

(56) References Cited

U.S. PATENT DOCUMENTS

| | | | | |
|---|---|---|---|---|
| 5,981,361 A * | 11/1999 | Yamada | ............. | H01L 21/6835 438/464 |
| 8,871,105 B2 * | 10/2014 | Winniczek | .......... | B81C 1/00619 216/41 |
| 9,112,050 B1 * | 8/2015 | Lei | .................... | H01L 21/67092 |
| 9,159,574 B2 * | 10/2015 | Yu | ..................... | H01L 21/76898 |
| 2003/0211752 A1 * | 11/2003 | Rattner | ............ | H01L 21/30655 438/719 |

(Continued)

FOREIGN PATENT DOCUMENTS

| | | |
|---|---|---|
| JP | 2014-513868 A | 6/2014 |
| JP | 2016-146395 A | 8/2016 |
| WO | 2012/125560 A2 | 9/2012 |

*Primary Examiner* — Shamim Ahmed
(74) *Attorney, Agent, or Firm* — Pearne & Gordon LLP

(57) ABSTRACT

An element chip smoothing method including: an element chip preparation step of preparing at least one element chip including a first surface covered with a resin film, a second surface opposite the first surface, and a sidewall connecting the first surface to the second surface and having ruggedness; a sidewall cleaning step of exposing the element chip to a first plasma, to remove deposits adhering to the sidewall, with the resin film allowed to continue to exist; a sidewall oxidation step of exposing the element chip to a second plasma, after the sidewall cleaning step, to oxidize a surface of the sidewall, with the resin film allowed to continue to exist; and a sidewall etching step of exposing the element chip to a third plasma, after the sidewall oxidation step, to etch the sidewall, with the resin film allowed to continue to exist.

4 Claims, 18 Drawing Sheets

(56) References Cited

U.S. PATENT DOCUMENTS

| | | | |
|---|---|---|---|
| 2006/0292877 A1* | 12/2006 | Lake | H01L 23/481 |
| | | | 438/694 |
| 2008/0163139 A1* | 7/2008 | Scheffer | H01L 22/20 |
| | | | 438/14 |
| 2010/0048001 A1* | 2/2010 | Harikai | H01J 37/32743 |
| | | | 438/464 |
| 2010/0055400 A1* | 3/2010 | Farr | H01L 21/02057 |
| | | | 428/156 |
| 2014/0017881 A1* | 1/2014 | Eaton | H01L 21/30655 |
| | | | 438/463 |
| 2014/0302678 A1* | 10/2014 | Paterson | H01J 37/321 |
| | | | 438/700 |
| 2016/0005634 A1* | 1/2016 | Ishikawa | H01L 21/568 |
| | | | 438/113 |
| 2016/0233111 A1 | 8/2016 | Shiota et al. | |
| 2018/0240678 A1* | 8/2018 | Itou | H01J 37/32743 |

* cited by examiner

ELEMENT CHIP SMOOTHING METHOD AND ELEMENT CHIP MANUFACTURING METHOD

CROSS REFERENCE TO RELATED APPLICATION

The present application is based on and claims priority under 35 U.S.C. § 119 with respect to the Japanese Patent Application No. 2019-152966 filed on Aug. 23, 2019 of which entire content is incorporated herein by reference into the present application.

TECHNICAL FIELD

The present invention relates to an element chip smoothing method, and an element chip manufacturing method.

BACKGROUND

There have been proposed various dicing methods for producing element chips from a substrate, such as a blade dicing method using a blade, a laser dicing method or stealth dicing method using laser, and a plasma dicing method using plasma. Among them, the plasma dicing method has been a subject of development as a process with less mechanical damage to the substrate and less deterioration in the device characteristics, as disclosed in Patent Documents 1 (JP 2014-513868 A) and 2 (JP 2016-146395 A). The plasma dicing method is performed by a Bosch or non-Bosch etching process.

In the non-Bosch process, the resulting element chip tends to have a smooth sidewall, but disadvantageously, side-etching tends to occur. Especially when using a substrate having a thickness of several hundred μm or more, side-etching as large as about several tens μm sometimes occurs.

The Bosch process is a technique in which etching using a plasma of a fluorine-based gas and film-deposition using a plasma of a fluorocarbon gas are cyclically repeated on a street (dicing region) defining element regions of a substrate, thereby to form and deepen a groove along the street. According to this technique, grooves with high aspect ratio can be formed. However, the etching in the Bosch process is isotropic, and because of its process mechanism, the machined surface or inner wall of the groove naturally has ruggedness known as scallops, which appears as a series of peaks and valleys. The scallops lead to an increase in leakage current, eventually leading to deterioration of the characteristics of the element chips.

Shortening the etching time is one possible way to reduce the ruggedness. Even by doing this, it is difficult to sufficiently reduce the ruggedness of the sidewall of the obtained element chips. Moreover, a shorter etching time means a smaller etching amount per one etching operation, which requires an increased number of cycles (number of repeating times) for dicing the substrate, and the productivity is sacrificed.

SUMMARY

One aspect of the present invention relates to an element chip smoothing method including: an element chip preparation step of preparing at least one element chip including a first surface covered with a resin film, a second surface opposite the first surface, and a sidewall connecting the first surface to the second surface and having ruggedness; a sidewall cleaning step of exposing the element chip to a first plasma, to remove deposits adhering to the sidewall, with the resin film allowed to continue to exist; a sidewall oxidation step of exposing the element chip to a second plasma, after the sidewall cleaning step, to oxidize a surface of the sidewall, with the resin film allowed to continue to exist; and a sidewall etching step of exposing the element chip to a third plasma, after the sidewall oxidation step, to etch the sidewall, with the resin film allowed to continue to exist.

Another aspect of the present invention relates to an element chip manufacturing method including: a substrate preparation step of preparing a substrate including a plurality of element regions and a dicing region defining the element regions, the substrate having a first surface and a second surface opposite the first surface; a resin film formation step of forming a resin film that covers the first surface; an opening formation step of forming an opening in the resin film, to expose the first surface along the dicing region; a plasma dicing step of repeating a cycle including an etching step of forming a groove along the exposed dicing region and a deposition step of depositing a film on an inner wall of the groove, to dice the substrate into at least one element chip including the first surface covered with the resin film, the second surface, and a sidewall connecting the first surface to the second surface and having ruggedness; a smoothing step of reducing the ruggedness of the sidewall; and a resin film removal step of removing the resin film covering the first surface of the element chip, after the smoothing step. The aforementioned smoothing step includes: a sidewall cleaning step of exposing the element chip to a first plasma, to remove deposits adhering to the sidewall, with the resin film allowed to continue to exist; a sidewall oxidation step of exposing the element chip to a second plasma, after the sidewall cleaning step, to oxidize a surface of the sidewall, with the resin film allowed to continue to exist; and a sidewall etching step of exposing the element chip to a third plasma, after the sidewall oxidation step, to etch the sidewall, with the resin film allowed to continue to exist.

According to the present invention, element chips having a smooth sidewall can be obtained.

DETAILED DESCRIPTION

Figure 1:
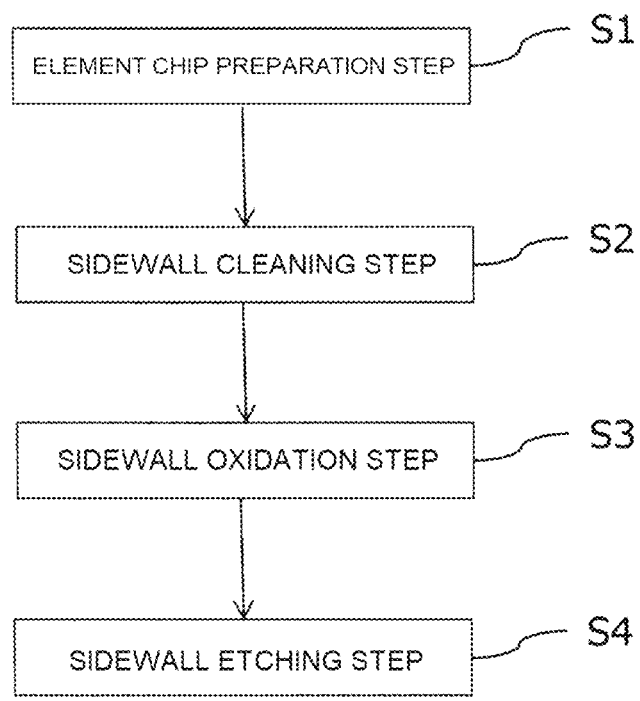
FIG. 1 is a flowchart of an element chip smoothing method according to an embodiment of the present invention.

The present embodiment is to reduce the ruggedness of the sidewall of element chips produced by a plasma dicing employing a Bosch process. In a plasma processing method according to the present embodiment, three steps of post-processing using plasma are applied to the element chips. These post-processing steps are performed while a resin film (mask) for protecting the element chips is allowed to exist.

The ruggedness of the sidewall means a difference in height between the lowest point (bottom) of a valley of any one of the scallops and the highest point (top) of one of two peaks adjacent to the valley, the one higher from the bottom than the other. That the ruggedness is reduced means that the above difference in height in any one of the scallops is reduced. According to the present embodiment, in most of the scallops formed on the sidewall, the ruggedness is reduced after the post-processing. A smaller height difference between the bottom and the top is more desirable, but the difference is not necessarily to be reduced to zero until the surface becomes completely smooth.

The first step performs sidewall cleaning to remove deposits adhering to the sidewall of the element chips. The Bosch process alternately repeats an etching step of forming a groove along the street (dicing region) and a deposition step of depositing a film (deposited film) on the inner wall of the groove. Accordingly, on the sidewall of the resultant element chips, scallops are formed, and the deposited film and a product formed by a reaction between the deposited film and the plasma (hereinafter simply, deposits) are adhering. The film is thickly deposited around the peaks of the scallops where the surfaces are more exposed to the plasma, and the deposits are also much adhering around the peaks of the scallops. When there are much deposits around the peaks, the peaks are difficult to be sufficiently etched in a subsequent sidewall etching step, failing to reduce the ruggedness to a desired level. Therefore, this step removes the deposits from the sidewall first, so that the sidewall of the element chips is exposed. This serves to allow the etching to proceed smoothly around the peaks.

The second step performs sidewall oxidation to oxidize the surface of the sidewall. Through this step, a layer containing an oxide of a material of the element chips (e.g., silicon oxide) is formed at an outermost surface of the sidewall of the element chips. The oxide layer thus formed prevents the sidewall from being excessively etched.

The third step performs sidewall etching to etch the sidewall. The oxide-containing layer formed in the second step serves as an electrical insulator, and thus, becomes electrically charged under a plasma atmosphere. Therefore, ions having etching ability (e.g., fluorine ions) contained in the plasma hardly collide with the sidewall of the element chips. However, as described above, the peaks of the scallops are more exposed to the plasma. Therefore, the peaks are likely to be more etched than the valleys. In other words, in this step, the scallops are etched preferentially around the peaks and less etched around the valleys. In this way, the ruggedness can be effectively reduced.

The plasma processing method according to the present embodiment is particularly suitably applicable as a method of smoothing the sidewall of the element chips produced by a plasma dicing employing a Bosch process. The present embodiment encompasses an element chip manufacturing method including a plasma dicing step.

A. Element Chip Smoothing Method

An element chip smoothing method according to the present embodiment includes: an element chip preparation step of preparing at least one element chip including a first surface covered with a resin film, a second surface opposite the first surface, and a sidewall connecting the first surface to the second surface and having ruggedness; a sidewall cleaning step of exposing the element chip to a first plasma, to remove deposits adhering to the sidewall, with the resin film allowed to continue to exist; a sidewall oxidation step of exposing the element chip to a second plasma, after the sidewall cleaning step, to oxidize a surface of the sidewall, with the resin film allowed to continue to exist; and a sidewall etching step of exposing the element chip to a third plasma, after the sidewall oxidation step, to etch the sidewall, with the resin film allowed to continue to exist.

FIG. 1 is a flowchart of the smoothing method according to an embodiment of the present invention.

(i) Element Chip Preparation Step (S1)

This step prepares at least one element chip including a first surface covered with a resin film, a second surface opposite the first surface, and a sidewall connecting the first surface to the second surface. The sidewall has ruggedness called scallops like a series of valleys and peaks. Such element chips are produced by a plasma dicing employing a Bosch process.

The element chip includes, for example, a semiconductor layer and a wiring layer.

The semiconductor layer contains, for example, silicon (Si), gallium arsenide (GaAs), gallium nitride (GaN), or silicon carbide (SiC). The semiconductor layer in the element chip may have any thickness; the thickness is, for example, 20 µm or more and 1000 µm or less, preferably 100 µm or more and 300 µm or less.

The wiring layer constitutes, for example, a semiconductor circuit, an electronic component element (e.g., LED, laser, MEMS), and may include an electrically insulating film, a metal material, a resin layer (e.g., polyimide), a resist layer, an electrode pad, a bump, and others. The insulating film may be in the form of a laminate with a wiring metal material (e.g., multilevel interconnect layer, redistribution layer).

The resin film contains a resist material, such as a thermosetting resin (e.g., polyimide), a photoresist (e.g., phenol resin), or a water-soluble resist (e.g., acrylic resin).

The resin film may have any thickness, but is preferably thick enough so as not be completely removed by plasma etching in the plasma dicing step and the smoothing step. The thickness of the resin film can be set, for example, by calculating an amount (thickness) of the resin film to be etched in the plasma dicing step and the smoothing step, to be thicker than the amount. The thickness of the resin film is, for example, 5 μm or more and 60 μm or less.

In view of ease of handling, a plurality of the element chips may be attached on a holding sheet secured to a frame surrounding them. In this case, the plurality of element chips can be processed all at once. The plurality of the element chips are spaced apart from each other. The space between the adjacent element chips may be set as appropriate according to, for example, the size of the element chips. A member including the frame and the holding sheet secured on the frame is referred to as a conveying carrier.

(Conveying Carrier)

The frame is a frame member having an opening large enough to surround the plurality of the element chips, and has a predetermined width and a substantially consistent thin thickness. The frame has such a rigidity that it can be conveyed with the holding sheet and the substrate held thereon. The opening of the frame may be of any shape, for example, circular, rectangular, or polygonal, such as hexagonal. The frame may be made of any material, for example, a metal, such as aluminum or stainless steel, or a resin.

The holding sheet may be made of any material. For easy attachment of the plurality of the element chips thereto, the holding sheet preferably includes an adhesive layer and a non-adhesive layer with flexibility.

The non-adhesive layer may be made of any material, for example, polyolefin such as polyethylene and polypropylene, polyester such as polyvinyl chloride and polyethylene terephthalate, and other thermoplastic resins. The resin film may include a rubber component for adding elasticity (e.g., ethylene-propylene rubber (EPM), ethylene-propylene-diene rubber (EPDM)), and various additives, such as a plasticizer, a softener, an antioxidant, and an electrically conductive material. The thermoplastic resin may have a functional group that reacts during photopolymerization reaction, such as an acryl group. The non-adhesive layer may have any thickness; the thickness is, for example, 50 μm or more and 300 μm or less, preferably 50 μm or more and 150 μm or less.

The holding sheet is attached at its periphery to the frame, with the side where the adhesive layer is disposed (adhesive side) in contact with the frame, to cover an opening of the frame. On the adhesive side exposed from the opening of the frame, the element chip is attached, with one of its principal surfaces (second surface) in contact with the adhesive side. The element chip is thus held on the holding sheet. The element chip may be held on the holding sheet via a die attach film (DAF).

The adhesive layer is preferably made of an adhesive component, the adhesive strength of which is reduced by ultraviolet (UV) irradiation. In picking up the element chip after the resin film is removed, the element chip can be easily peeled off from the adhesive layer by UV irradiation, which eases the pickup. The adhesive layer can be obtained by, for example, applying a UV curing acrylic adhesive on one side of the non-adhesive layer, in a thickness of 5 μm or more and 100 μm or less (preferably 5 μm or more and 15 μm or less).

Figure 2A:
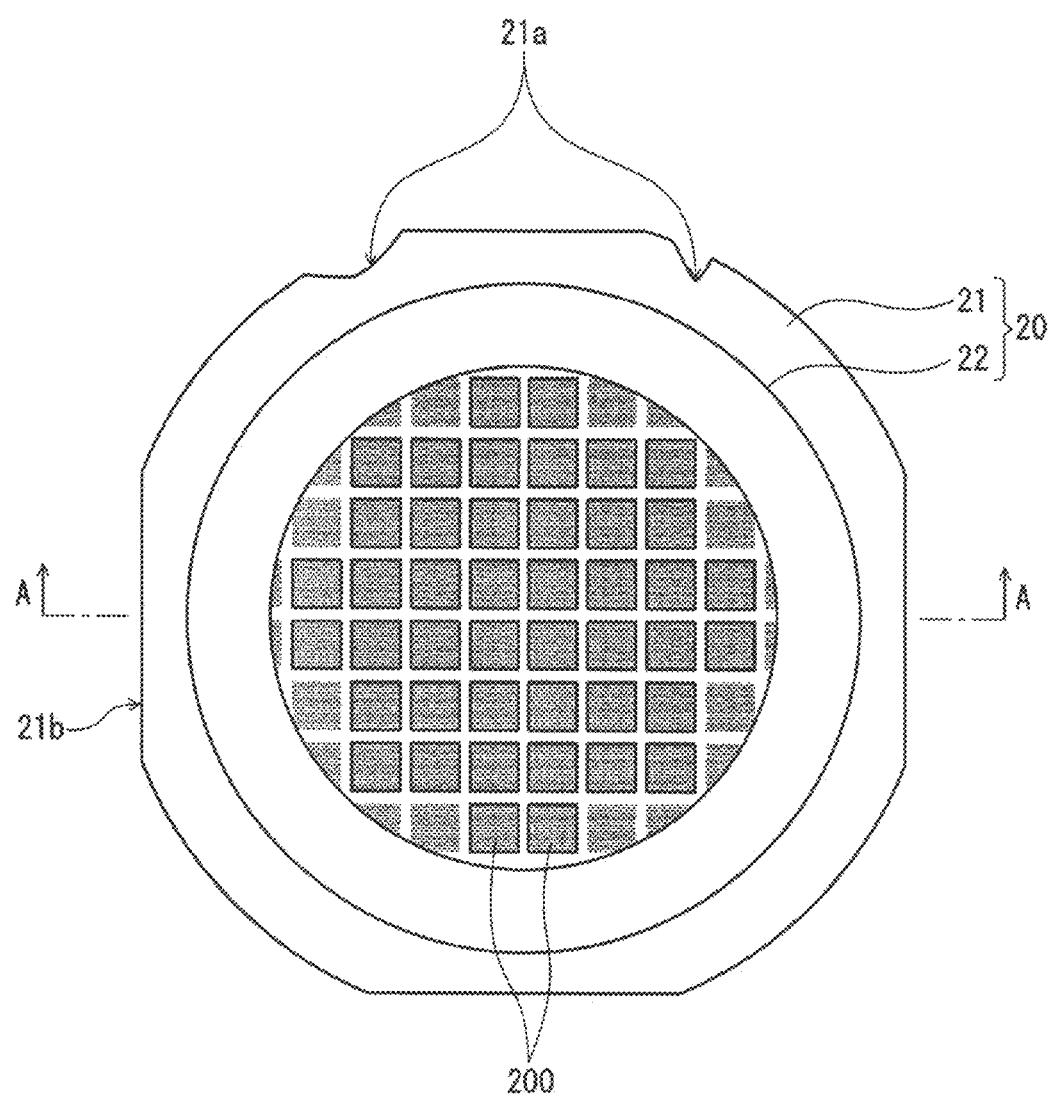
FIG. 2A is a schematic top view of a plurality of element chips prepared by an element chip preparation step according to an embodiment of the present invention.
Figure 2B:
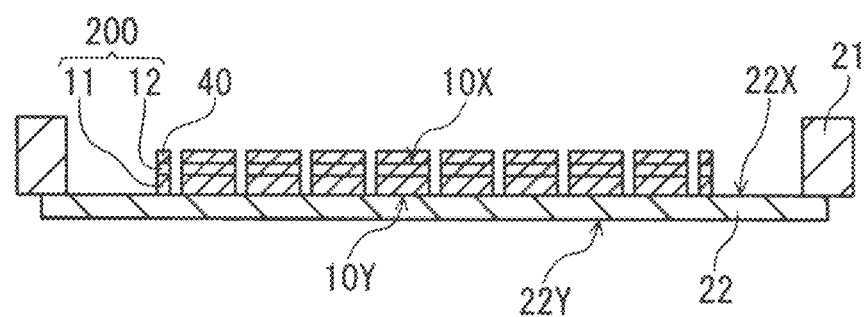
FIG. 2B is a cross-sectional view taken along a line A-A of FIG. 2A.

FIG. 2A is a schematic top view of a plurality of element chips prepared in the element chip preparation step, and FIG. 2B is a cross-sectional view taken along a line A-A of FIG. 2A. FIG. 2B omits the scallops and the deposits for illustrative convenience.

A conveying carrier 20 includes a frame 21 and a holding sheet 22 secured to the frame 21. The frame 21 may be provided with a notch 21a and a corner cut 21b for correct positioning. The holding sheet 22 has an adhesive side 22X and a non-adhesive side 22Y, and is attached at its periphery of the adhesive side 22X to one side of the frame 21. On a portion of the adhesive side 22X exposed from the opening of the frame 21, an element chip 200 is placed, with a second surface 10Y facing the portion.

On the adhesive side 22X of the holding sheet 22, a plurality of the element chips 200 are attached with a space between them. The element chips 200 each include a semiconductor layer 11 and a wiring layer 12 disposed on the first surface side of the semiconductor layer 11. A first surface 10X is covered with a resin film 40.

Figure 3:
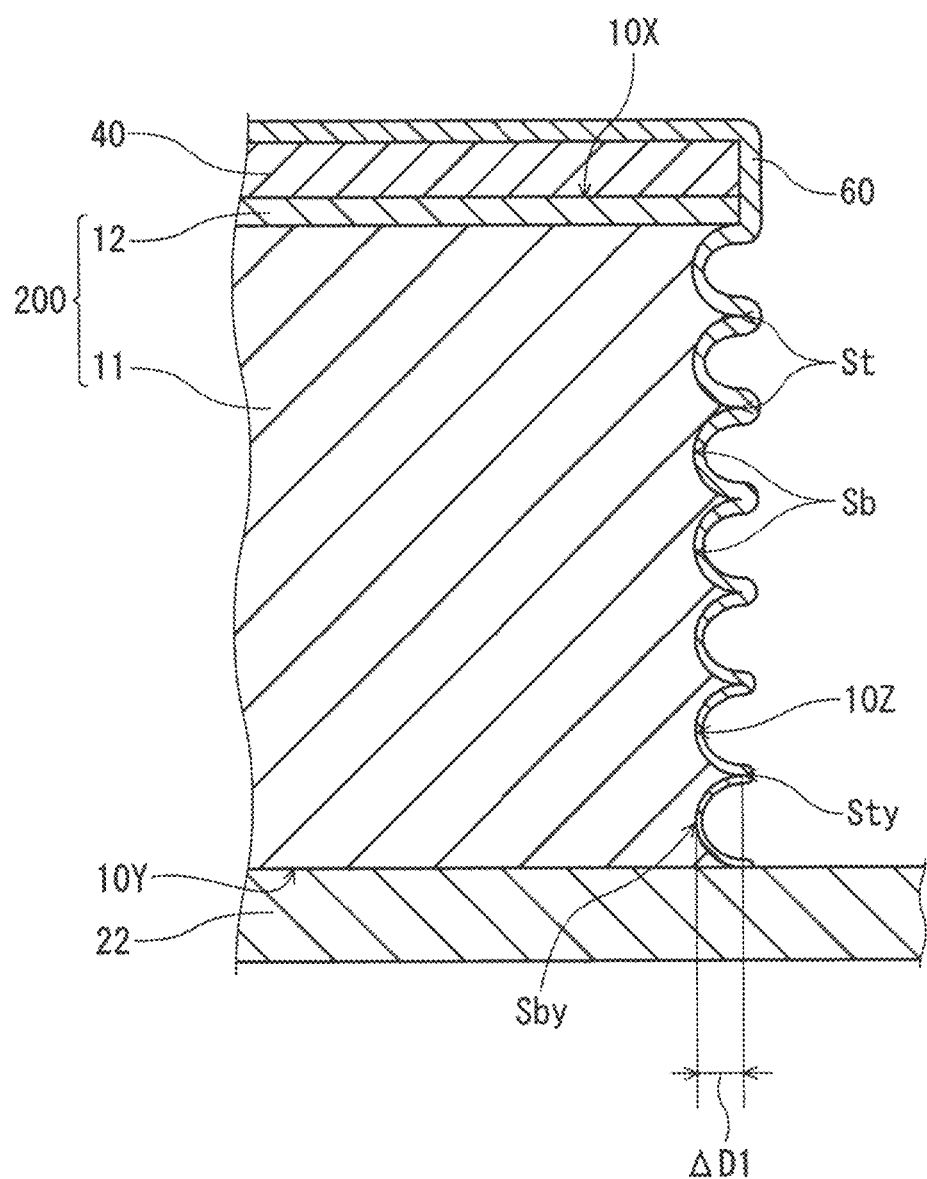
FIG. 3 is a schematic cross-sectional view of an essential part of the prepared element chip.

FIG. 3 is a schematic cross-sectional view of an essential part of a prepared element chip. A sidewall 10Z of the element chip 200 has scallops. The scallops are formed of a plurality of peaks St and valleys Sb. The peaks St are more thickly covered with deposits 60 than the valleys Sb. A peak top Sty and a valley bottom Sby of the scallop near the second surface 10Y have a height difference ΔD1. Note that the scallops and the deposits are illustrated with exaggeration for ease of understanding.

Figure 4:
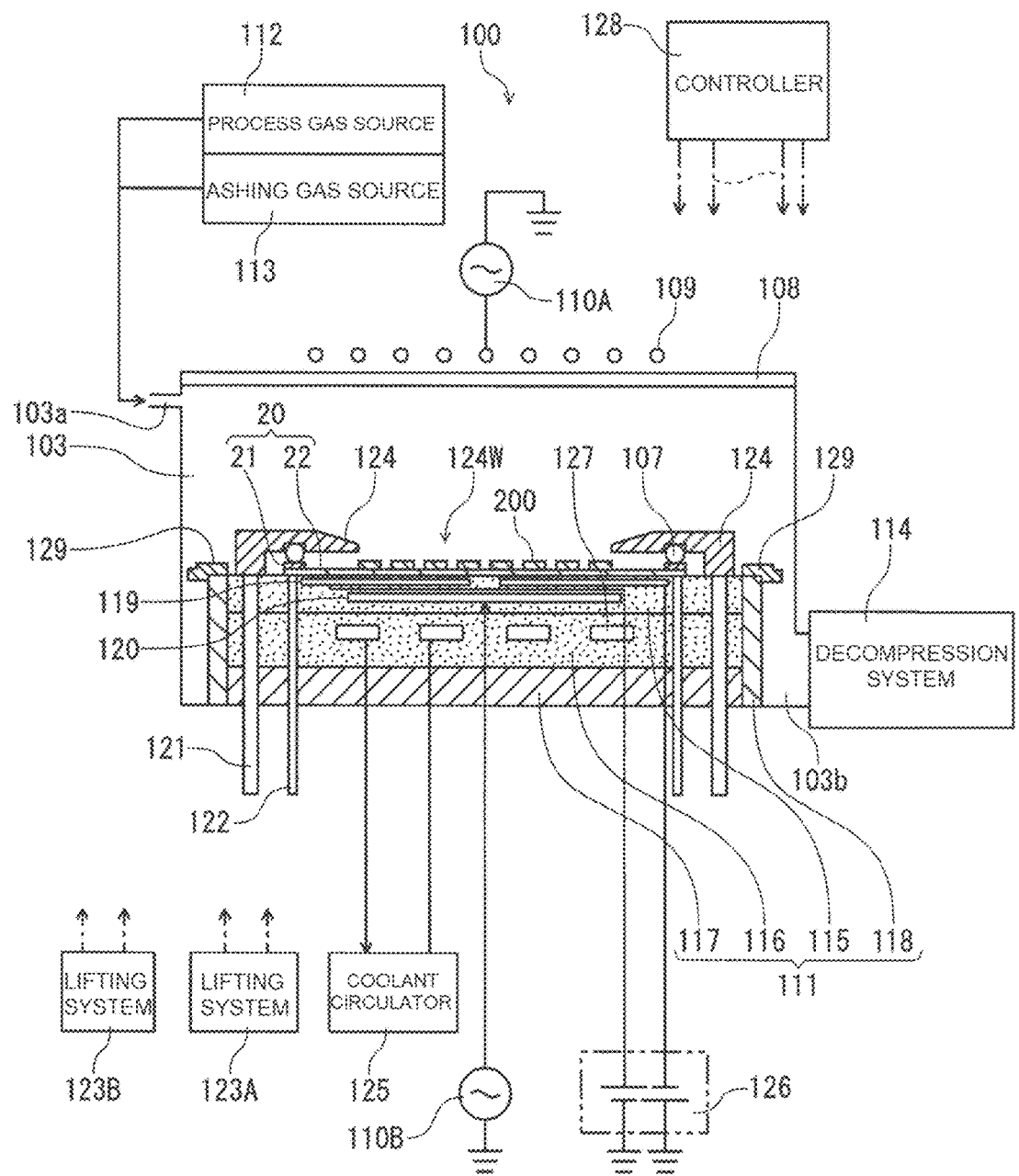
FIG. 4 is a schematic sectional diagram of a plasma processing apparatus used in an embodiment of the present invention.

The subsequent steps, i.e., sidewall cleaning step, sidewall oxidation step, and sidewall etching step, are performed using a plasma processing apparatus. An example of the plasma processing apparatus used in the above steps will be specifically described with reference to FIG. 4. Note that the plasma processing apparatus is not limited thereto. FIG. 4 is a schematic sectional diagram of a plasma processing apparatus 100. In FIG. 4, a plurality of the element chips are held on the conveying carrier.

(Plasma Processing Apparatus)

The plasma processing apparatus 100 includes a stage 111. The conveying carrier 20 is set on the stage 111, such that one of the surfaces of the holding sheet 22, the surface holding the substrate 10, is faced upward. The stage 111 has such a size that the whole conveying carrier 20 can be seated thereon. Above the stage 111, a cover 124 having a window 124W for exposing at least one of element chips 200 therefrom is arranged. The cover 124 is provided with holding members 107 for holding the frame 21 downward while the frame 21 is on the stage 111. The holding members 107 are each preferably a member that can achieve point contact with the frame 21 (e.g., a coil spring or an elastic resin). This can correct a distortion of the frame 21, while restricting a thermal communication between the frame 21 and the cover 124.

The stage 111 and the cover 124 are arranged in a vacuum chamber 103. The vacuum chamber 103 is approximately cylindrical with the top open. The open top is closed by a dielectric member 108 serving as a lid. Examples of the constituent material of the vacuum chamber 103 include aluminum, stainless steel (SUS), and aluminum with anodic oxide coating. Examples of the constituent material of the dielectric member 108 include yttrium oxide ($Y_2O_3$), aluminum nitride (AlN), alumina ($Al_2O_3$), quartz ($SiO_2$), and other dielectric materials. Above the dielectric member 108, a first electrode 109 serving as an upper electrode is arranged. The first electrode 109 is electrically connected to a first high-frequency power source 110A. The stage 111 is positioned on the bottom side in the vacuum chamber 103.

The vacuum chamber 103 is provided with a gas inlet 103a and a gas outlet 103b. The gas inlet 103a is connected to plasma-generating gas (process gas) supply sources, i.e., a process gas source 112 and an ashing gas source 113, each through a conduit. The gas outlet 103b is connected to a decompression system 114 including a vacuum pump for exhausting the gas within the vacuum chamber 103 to reduce the pressure therein. While supplying a process gas into the vacuum chamber 103, the first electrode 109 is supplied with a high-frequency power from the first high-frequency power source 110A. A plasma is thus generated in the vacuum chamber 103.

The stage 111 includes an electrode layer 115, a metal layer 116, and a base table 117 supporting the electrode layer 115 and the metal layer 116, each being approximately circular. The stage 111 further includes a peripheral member 118 surrounding the electrode layer 115, the metal layer 116, and the base table 117. The peripheral member 118 is formed of a metal having electrical conductivity and etching resistance, and serves to protect the electrode layer 115, the metal layer 116, and the base table 117 from plasma exposure. On the top surface of the peripheral member 118, an annular circumferential ring 129 is provided. The circumferential ring 129 serves to protect the top surface of the peripheral member 118 from plasma exposure. The electrode layer 115 and the circumferential ring 129 are formed of, for example, the dielectric material as listed above.

Within the electrode layer 115, an electrode for electrostatic chucking (hereinafter, ESC electrode 119), and a second electrode 120 electrically connected to a second high-frequency power source 110B are disposed. The ESC electrode 119 is electrically connected to a DC power source 126. The ESC electrode 119 and the DC power source 126 constitute an electrostatic chuck system. The electrostatic chuck system pulls the holding sheet 22 onto the stage 111 and secures it thereto. Although a description will be made below of a case where the electrostatic chuck system is used as a securing system for securing the holding sheet 22 to the stage 111, this should not be taken as a limitation. A clamp (not shown) may be used for securing the holding sheet 22 to the stage 111.

The metal layer 116 is formed of, for example, aluminum with an anodic oxidation coating. The metal layer 116 contains a coolant channel 127 configured to cool the stage 111. By cooling the stage 111, the holding sheet 22 set on the stage 111 is cooled down, and the cover 124 partially in contact with the stage 111 is also cooled down. This protects the element chips 200 and the holding sheet 22 from being damaged by being heated during plasma processing. A coolant in the coolant channel 127 is circulated by a coolant circulator 125.

Around the peripheral portion of the stage 111, a plurality of support members 122 extending through the stage 111 are provided. The support members 122 support the frame 21 of the conveying carrier 20. The support members 122 are driven by a first lifting system 123A, and move upward and downward. The conveying carrier 20 having delivered into the vacuum chamber 103 is passed onto the support members 122 at a predetermined raised position. Then the support members 122 descend until their top surfaces become flush with or lower than the top surface of the stage 111, which sets the conveying carrier 20 at a predetermined position on the stage 111.

A plurality of lifting rods 121 are coupled to the peripheral edge of the cover 124, to lift and lower the cover 124. The lifting rods 121 are driven by a second lifting system 123B. The lifting and lowering operation of the cover 124 by the second lifting systems 123B can be controlled independently from the operation by the first lifting system 123A.

Figure 5:
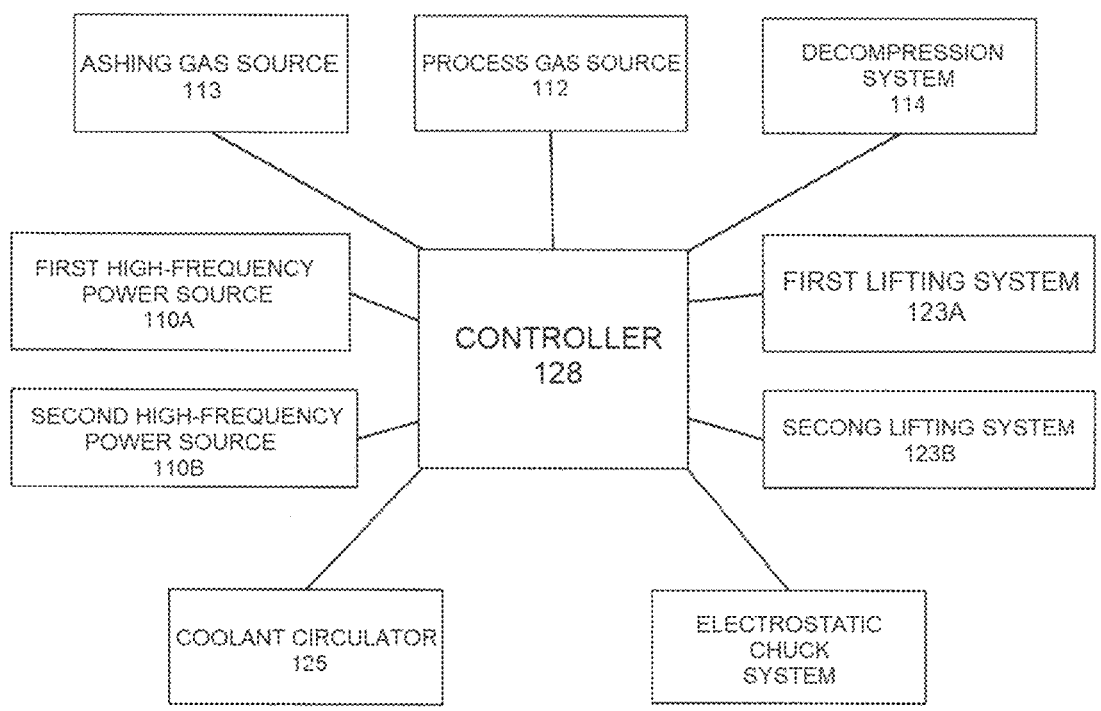
FIG. 5 is a block diagram of the plasma processing apparatus used in an embodiment of the present invention.

A controller 128 is configured to control operations of component elements of the plasma processing unit 100 including the first high-frequency power source 110A, the second high-frequency power source 110B, the process gas source 112, the ashing gas source 113, the decompression system 114, the coolant circulator 125, the first and second lifting systems 123A and 123B, and the electrostatic chuck system. FIG. 5 is a block diagram of the plasma processing apparatus used in the present embodiment.

After the conveying carrier 20 holding the element chips 200 is delivered into the vacuum chamber 103, the element chips 200 are subjected to plasma processing while being seated on the stage 111.

When delivering the substrate 10, within the vacuum chamber 103, the cover 124 is lifted to a predetermined position by means of the lifting rods 121. A gate valve (not shown) opens to allow the conveying carrier 20 to be delivered into the vacuum chamber 103. The support members 122 are on standby at a raised position. When the conveying carrier 20 reaches a predetermined position above the stage 111, the conveying carrier 20 is passed onto the support members 122. The conveying carrier 20 is placed onto the support members 122, with the adhesive side 22X of the holding sheet 22 faced upward.

After the conveying carrier 20 is passed onto the support members 122, the vacuum chamber 103 is closed in a hermetically sealed state. Next, the support members 122 start descending. When the support members 122 have descended until their top surfaces become flush with or lower than the top surface of the stage 111, the conveying carrier 20 is set on the stage 111. Then the lifting rods 121 are driven to lower the cover 124 to a predetermined position. The distance between the cover 124 and the stage 111 is adjusted so that the holding members 107 in the cover 124 each come in point-contact with the frame 21. In this way, the frame 21 is pressed downward by the holding members 107, and covered with the cover 124, with at least part of the substrate 10 exposed from the window 124W.

The cover 124 is, for example, doughnut-shaped having an approximately circular outline, and has a consistent width and thin thickness. The diameter of the window 124W is smaller than the inner diameter of the frame 21, and the outer diameter thereof is greater than the outer diameter of the frame 21. Therefore, when the cover 124 is lowered while the conveying carrier 20 is set on the stage 111 at a predetermined position, the cover 124 can cover the frame 21, with at least one of the element chips 200 exposed from the window 124W.

The cover 124 is formed of, for example, a dielectric such as ceramics (e.g., alumina, aluminum nitride) or quarts, or a metal such as aluminum or aluminum with an anodic oxidation coating. The holding members 107 can be formed of the aforementioned dielectric or metal, or a resin material.

After the conveying carrier 20 is passed onto the support members 122, a voltage is applied to the ESC electrode 119 from the DC power source 126. By doing this, the holding sheet 22 is brought into contact with the stage 111 and concurrently, is electrostatically chucked on the stage 111. The voltage application to the ESC electrode 119 may be initiated after the holding sheet 22 is set on (or comes in contact with) the stage 111.

Upon completion of plasma processing, the vacuum chamber 103 is evacuated, and the gate valve opens. The conveying carrier 20 holding a plurality of the element chips 200 is delivered out of the plasma processing unit 100 by means of a conveying system having entered through the gate valve. After the conveying carrier 20 is delivered out, the gate valve is immediately closed. The conveying carrier 20 may be delivered out by performing the above-mentioned procedures of setting the conveying carrier 20 on the stage 11 in the reverse order. Specifically, after the cover 124 is lifted to a predetermined position, the voltage applied to the ESC electrode 119 is cut off, to release the chucking of the conveying carrier 20 to the stage 111. Then, the support members 122 are raised. After the support members 122 reach a predetermined raised position, the conveying carrier 20 is delivered out.

(ii) Sidewall Cleaning Step (S2)

On the sidewall of the element chip 200, for example, deposits including a film deposited during the Bosch process (deposited film) and a product formed by a reaction between the deposited film and the plasma are adhering. Such deposits contain an organic substance as a main component (i.e., a component occupying 50% by mass or more). In this step, the deposits adhering to the sidewall of the element chip are removed using a first plasma.

The deposits tend to much adhere particularly around the peaks of the scallops. When the deposits are left around the peaks, in a subsequent sidewall etching step, many of the ions are consumed for removing the deposits, failing to allow the etching to proceed smoothly around the peaks. On the other hand, around the valleys where there are less deposits, etching tend to proceed smoothly, resulting in a greater difference in height between the peaks and valleys. Desirably, the sidewall cleaning step removes the deposits to such an extent that the underlying layer is exposed around the peaks. By exposing the underlying layer around the peaks in the sidewall cleaning step, the ruggedness can be easily reduced.

For removing the deposits, for example, a first plasma generated from a first process gas containing oxygen ($O_2$) is used. The deposits containing an organic substance as a main component can be efficiently removed by the first plasma derived from oxygen. The first process gas may contain a fluorine-containing gas in addition to $O_2$. In this case, the deposits tend to be more effectively removed. Examples of the fluorine-containing gas include a fluorocarbon gas (e.g., $CF_4$, $C_4F_8$), a fluorohydrocarbon gas (e.g., $CHF_3$), and $SF_6$. The ratio of 02 in the first process gas may be 10 vol % or more and less than 100 vol %, and may be 30 vol % or more and 98 vol % or less.

The conditions for generating the first plasma may be set as appropriate according to the amount and components of the deposits and other factors. However, the first plasma is preferably generated under such a condition that the sidewall is not excessively oxidized. When the sidewall is excessively oxidized, the sidewall tends to become electrically charged, from which the deposits become difficult to be removed. When some deposits are left, even though below-described sidewall oxidation step and sidewall etching step are subsequently performed, a desirably smooth sidewall is difficult to obtain.

To generate a first plasma so as not to excessively oxidize the sidewall, for example, $O_2$ is preferably used in combination with a fluorocarbon gas. By using a fluorocarbon gas in combination, the ratio of $O_2$ in the first process gas is decreased, and the oxidation of the sidewall tends to be slowed. In addition, even when the sidewall is oxidized, the etching of the sidewall itself proceeds through the reaction of the sidewall with fluorine ions. Therefore, excessive oxidation of the sidewall can be suppressed.

Specifically, for example, a mixed gas of $O_2$ (60 vol %) and $CF_4$ (40 vol %) is introduced as a process gas into the vacuum chamber at a rate of 5 sccm or more and 500 sccm or less. The pressure in the vacuum chamber may be 0.5 Pa or more and 30 Pa or less. The input power from the first high-frequency power source to the first electrode may be 500 W or more and 4800 W or less. In addition, a high-frequency power of 20 W or more and 1000 W or less may be supplied to the second electrode, to apply a bias voltage to the stage on which the substrate is placed. The processing time may be, for example, 3 sec or more and 300 sec or less.

Figure 6:
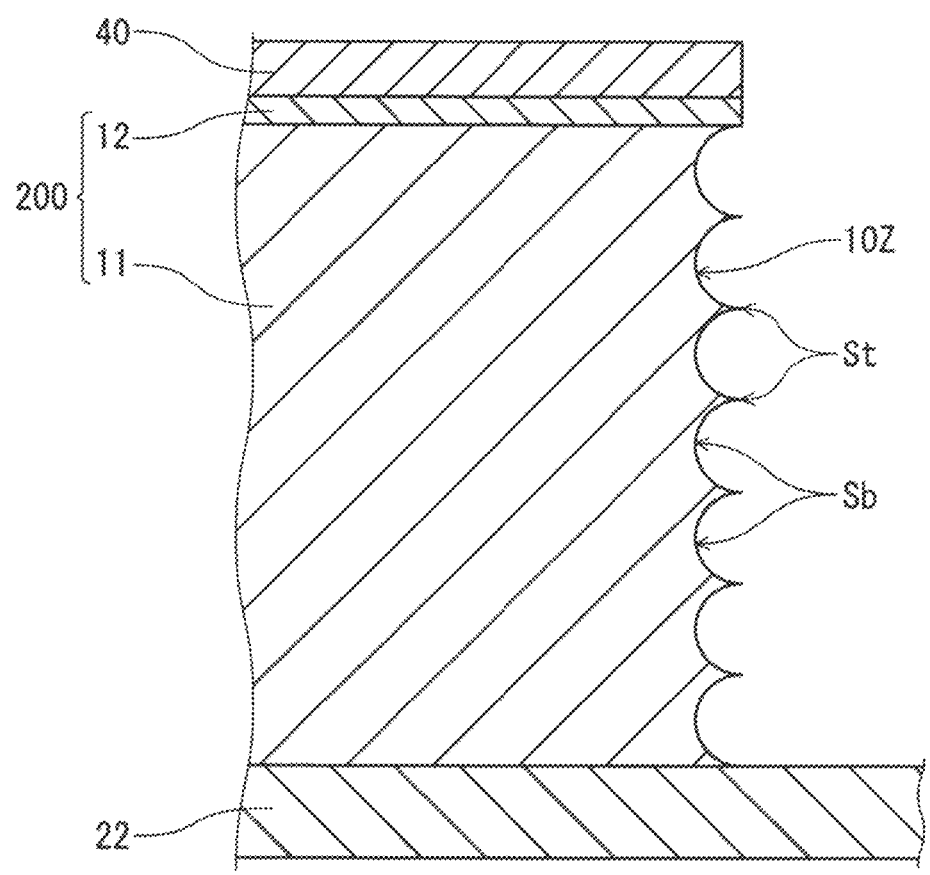
FIG. 6 is a schematic cross-sectional view of an essential part of the element chip after a sidewall cleaning step.

FIG. 6 is a schematic cross-sectional view of an essential part of the element chip after the sidewall cleaning step. The deposits are removed from both the peaks St and the valleys Sb of the sidewall 10Z of the element chip 200, exposing the semiconductor layer 11. On the other hand, the resin film 40 is allowed to continue to exist. Thus, in a subsequent step (sidewall oxidation step), the upper surface of the element chip is unlikely to be damaged by plasma exposure.

(iii) Sidewall Oxidation Step (S3)

This step oxidizes the surface of the sidewall of the element chip. As a result, an electrically insulating layer containing an oxide of a material of the element chip (e.g., silicon oxide) is formed at the outermost surface of the sidewall. The oxide layer having electrical insulating property serves to prevent the sidewall from being excessively etched.

For oxidizing the sidewall, for example, a second plasma generated from a second process gas containing oxygen ($O_2$) is used. The second process gas may contain, together with $O_2$, a carbon oxide gas, such as $CO_2$ or CO. In view of the oxidation effect, the ratio of $O_2$ in the second process gas may be 10 vol % or more and less than 100 vol %, and may be 30 vol % or more 98 vol % or less.

There is no particular limitation on the conditions for generating the second plasma.

Specifically, for example, $O_2$ is introduced as a process gas into the vacuum chamber at a rate of 5 sccm or more and 500 sccm or less. The pressure in the vacuum chamber may be 0.5 Pa or more and 30 Pa or less. The input power from the first high-frequency power source to the first electrode may be 500 W or more and 4800 W or less. In addition, a high-frequency power of 20 W or more and 1000 W or less may be supplied to the second electrode, to apply a bias voltage to the stage on which the substrate is placed. The processing time may be, for example, 3 sec or more and 300 sec or less.

Figure 7:
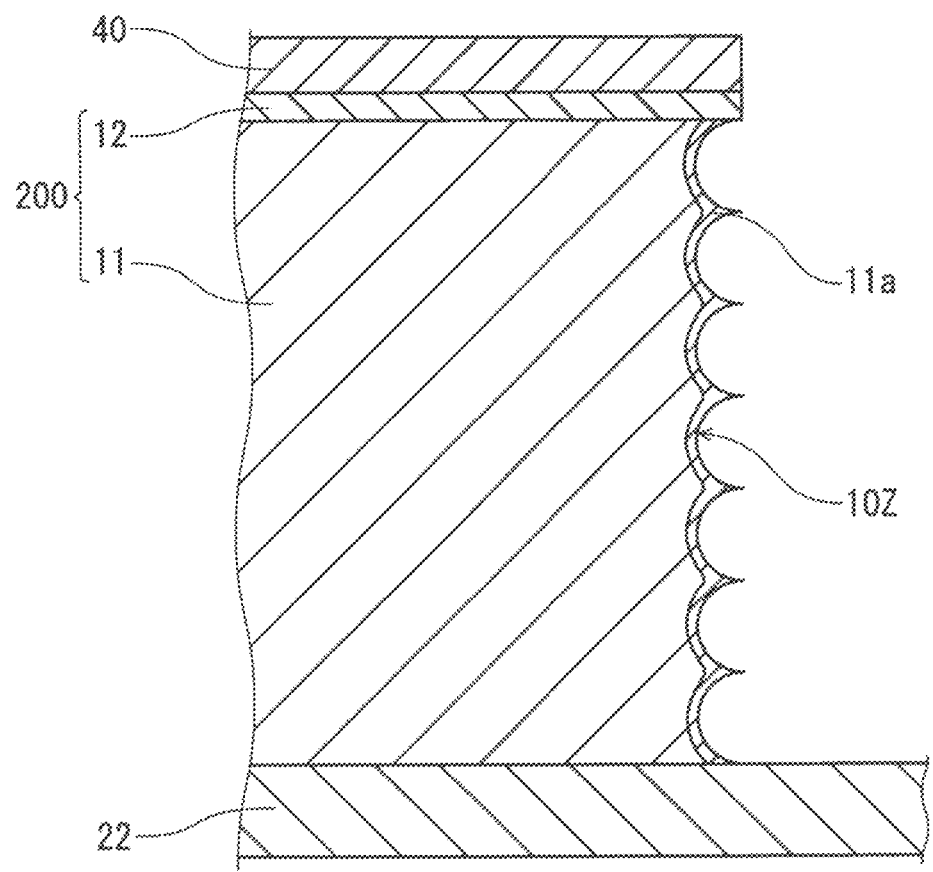
FIG. 7 is a schematic cross-sectional view of an essential part of the element chip after a sidewall oxidation step.

FIG. 7 is a schematic cross-sectional view of an essential part of the element chip after the sidewall oxidation step. The outermost surface of the sidewall 10Z of the element chip 200 is oxidized, forming an oxide layer 11a derived from the semiconductor layer 11. The resin film 40 is still allowed to continue to exist. Thus, in a subsequent step (sidewall etching step), the upper surface of the element chip is unlikely to be damaged by plasma exposure.

(iv) Sidewall Etching Step (S4)

This step etches the sidewall. The sidewall has an outermost surface which is an oxide layer serving as an electrical insulator, and thus, is difficult to be etched. Although with such difficulty, since the peaks of the scallops are much exposed to the plasma, the peaks tend to be comparatively easily etched. Therefore, in this step, the scallops are much etched around the peaks but are less etched around the valleys. In this way, the ruggedness can be reduced.

For etching the sidewall, a third plasma generated from a third process gas including a fluorine-containing gas is used. By using a plasma containing fluorine, the sidewall (semiconductor layer) can be efficiently etched. Examples of the fluorine-containing gas include, as described above, a fluorocarbon gas, such as $CF_4$ or $C_4F_8$, a fluorohydrocarbon gas, such as $CHF_3$, and $SF_6$. Among them, $SF_6$ is preferred because of its high etching effect.

The third process gas may further include oxygen gas. In this case, the etching amount can be easily controlled, and excessive etching of the sidewall can be suppressed. The ratio of $SF_6$ in the third process gas may be 10 vol % or more and less than 100 vol %, and may be 30 vol % or more and 98 vol % or less.

There is no particular limitation on the conditions for generating the third plasma. Specifically, for example, a mixed gas of $SF_6$ (50 vol %) and 02 (50 vol %) is introduced as a process gas into the vacuum chamber at a rate of 5 sccm or more and 500 sccm or less. The pressure in the vacuum chamber may be 0.5 Pa or more and 30 Pa or less. The input power from the first high-frequency power source to the first electrode may be 500 W or more and 4800 W or less. In addition, a high-frequency power of 20 W or more and 1000 W or less may be supplied to the second electrode, to apply a bias voltage to the stage on which the substrate is placed. The processing time may be, for example, 3 sec or more and 300 sec or less.

Figure 8:
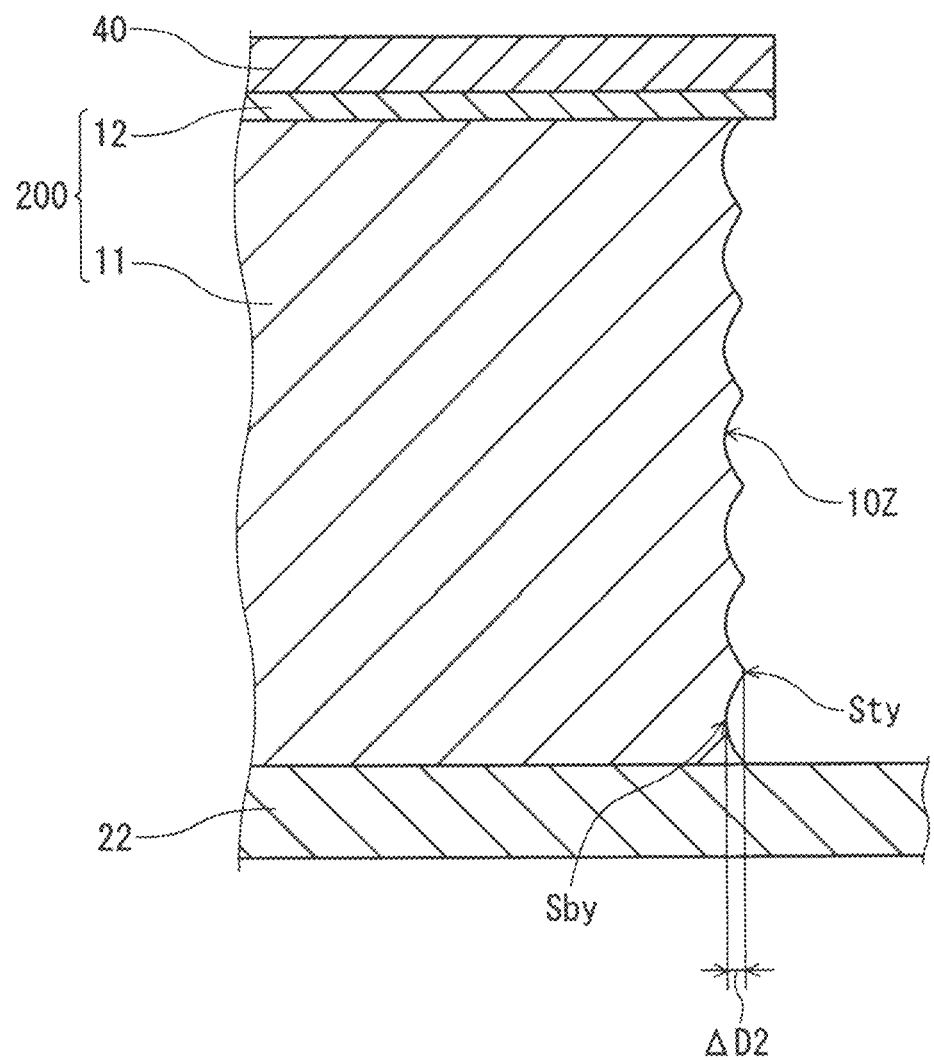
FIG. 8 is a schematic cross-sectional view of an essential part of the element chip after a sidewall etching step.

FIG. 8 is a schematic cross-sectional view of an essential part of the element chip after the sidewall etching step. The peaks St of the sidewall 10Z of the element chip 200 are preferentially etched, and as a result, a height difference ΔD2 between the peak top Sty and the valley bottom Sby of the scallop formed near the second surface 10Y is smaller than the height difference ΔD1 (see FIG. 3) before the sidewall cleaning step (ΔD2<ΔD1). The resin film 40 is yet allowed to continue to exist.

The sidewall oxidation step and the sidewall etching step may be repeated alternately a plurality of times. The oxide layer having formed around the valleys by the sidewall oxidation step is somewhat etched by the sidewall etching step. Therefore, a new oxide layer that hinders the etching is formed again after the etching, to protect the valleys with the oxide layer. This is followed by etching. By repeating this cycle, the ruggedness can be reduced, with hardly causing the receding of the sidewall, or the side-etching.

Figure 9:
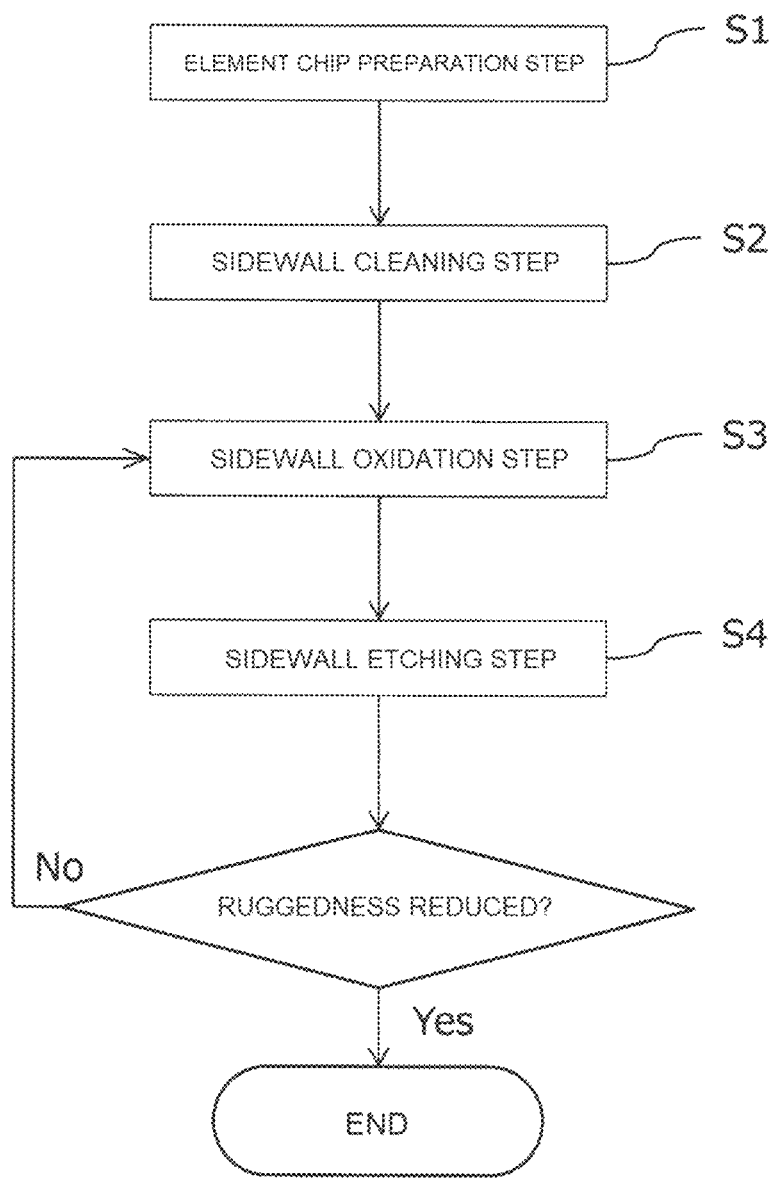
FIG. 9 is a flowchart of another element chip smoothing method according to an embodiment of the present invention.

FIG. 9 is a flowchart of another element chip smoothing method according to an embodiment of the present invention. After the first sidewall etching step (S4), a judgement is made as to whether the ruggedness is reduced to a desired level. If the ruggedness is judged as not having been reduced sufficiently, the sidewall oxidation step (S3) and the sidewall etching step (S4) are performed again. Then, the ruggedness is checked again. The sidewall oxidation step (S3) and sidewall etching step (S4) are repeated until the ruggedness is judged as having been reduced sufficiently. If the reduction is sufficient, the process ends.

B. Element Chip Manufacturing Method

An element chip manufacturing method according to an embodiment of the present embodiment includes: a substrate preparation step of preparing a substrate including a plurality of element regions and a dicing region defining the element regions, the substrate having a first surface and a second surface opposite the first surface; a resin film formation step of forming a resin film that covers the first surface; an opening formation step of forming an opening in the resin film, to expose the first surface along the dicing region; a plasma dicing step of repeating a cycle including an etching step of forming a groove along the exposed dicing region and a deposition step of depositing a film on an inner wall of the groove, to dice the substrate into at least one element chip including a first surface covered with a resin film, a second surface opposite the first surface, and a sidewall connecting the first surface to the second surface and having ruggedness; a smoothing step of reducing the ruggedness of the sidewall; and a resin film removal step of removing the resin film covering the first surface of the element chip, after the smoothing step.

The smoothing method includes: a sidewall cleaning step of exposing the element chip to a first plasma, to remove deposits adhering to the sidewall, with the resin film allowed to continue to exist; a sidewall oxidation step of exposing the element chip to a second plasma, after the sidewall cleaning step, to oxidize a surface of the sidewall, with the resin film allowed to continue to exist; and a sidewall etching step of exposing the element chip to a third plasma, after the sidewall oxidation step, to etch the sidewall, with the resin film allowed to continue to exist.

Figure 10:
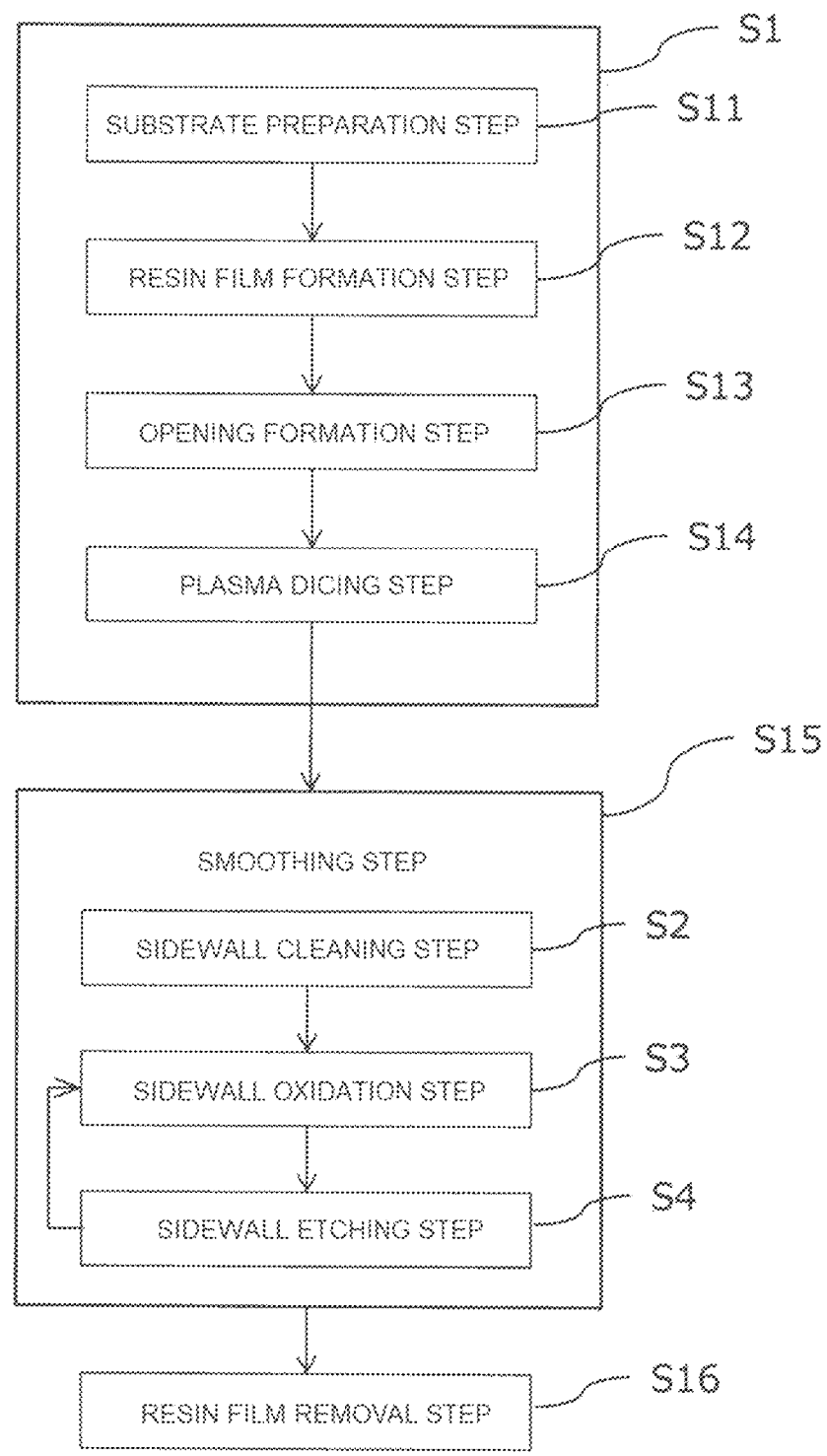
FIG. 10 is a flowchart of an element chip manufacturing method according to an embodiment of the present invention.

FIG. 10 is a flowchart of an element chip manufacturing method according to an embodiment of the present invention.

(1) Substrate Preparation Step (S11)

A substrate subjected to dicing is prepared first.

(Substrate)

The substrate has a first surface and a second surface and includes a plurality of element regions and a dicing region defining the element regions. The substrate includes a semiconductor layer. The element regions of the substrate may further include a wiring layer. The dicing region of the substrate may further include an electrically insulating film and a metal material, such as TEG (Test Element Group). Etching the substrate along the dicing region provides a plurality of element chips.

The substrate may be of any size, and is, for example, about 50 mm to 300 mm in maximum diameter. The substrate may be of any shape, and is, for example, circular or rectangular. The substrate may be provided with a cut, such as an orientation flat or a notch.

The shape of the dicing region may be set as appropriate according to the shape of desired element chips, without limited to a straight linear shape, and may be, for example, a zigzag shape or a wavy line shape. The element chip is, for example, rectangular or hexagonal in shape.

The width of the dicing region may be set as appropriate according to the sizes of the substrate and the element chips, and others. The width of the dicing region is, for example, 10 μm or more and 300 μm or less. A plurality of the dicing regions may have the same width or different widths. The dicing region is typically formed in plural numbers on the substrate. The pitch between the dicing regions adjacent to each other also may be set as appropriate according to the sizes of the substrate and the element chips, and others.

The substrate may be attached at the second surface to a holding sheet secured on a frame. This increases the ease of handling. Dividing the substrate attached to the holding sheet provides a plurality of element chips that are spaced apart from each other on the holding sheet. The shape, material, etc. of the frame and the holding sheet are as described above.

Figure 11:
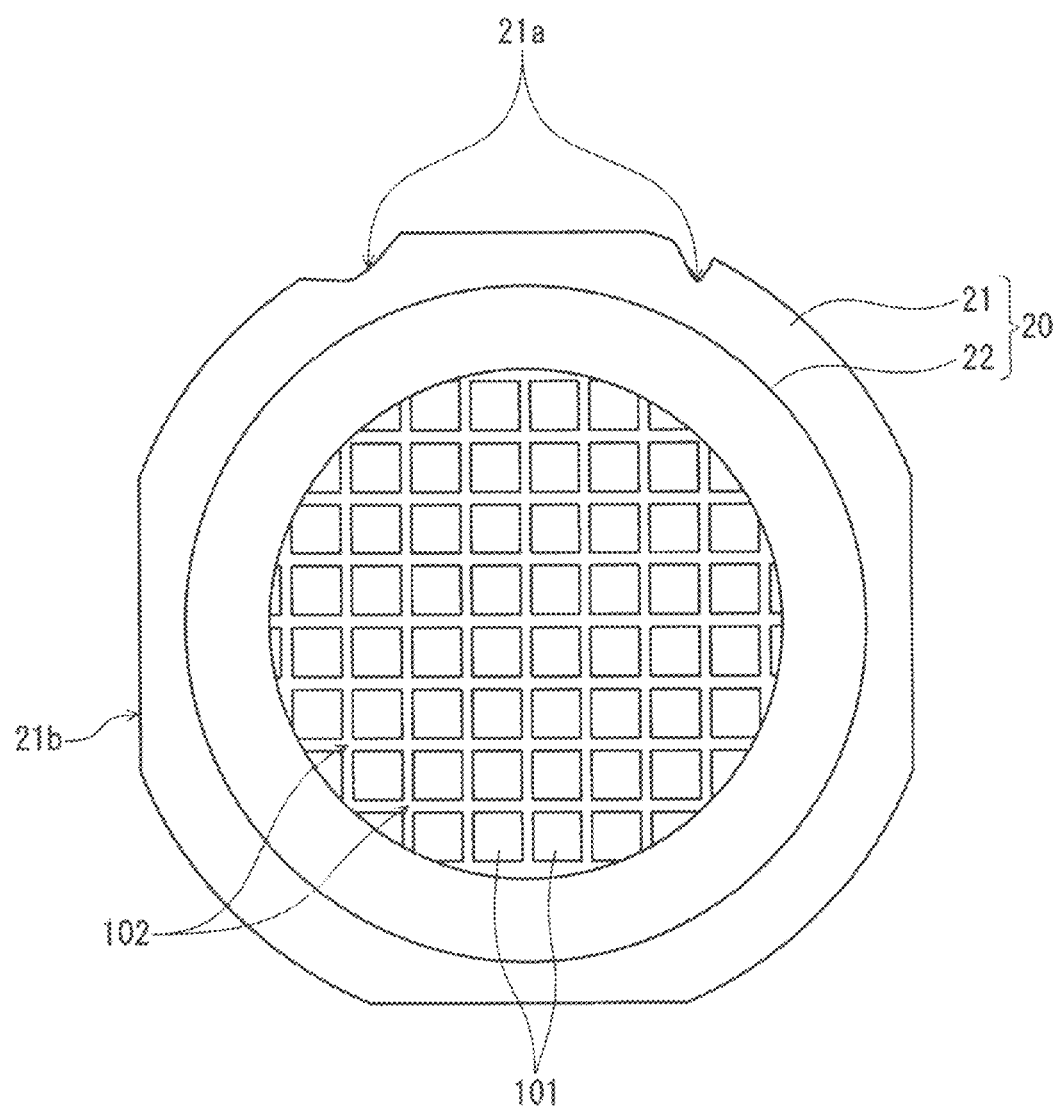
FIG. 11 is a schematic top view of a substrate prepared by a preparation step according to an embodiment of the present invention.
Figure 12:
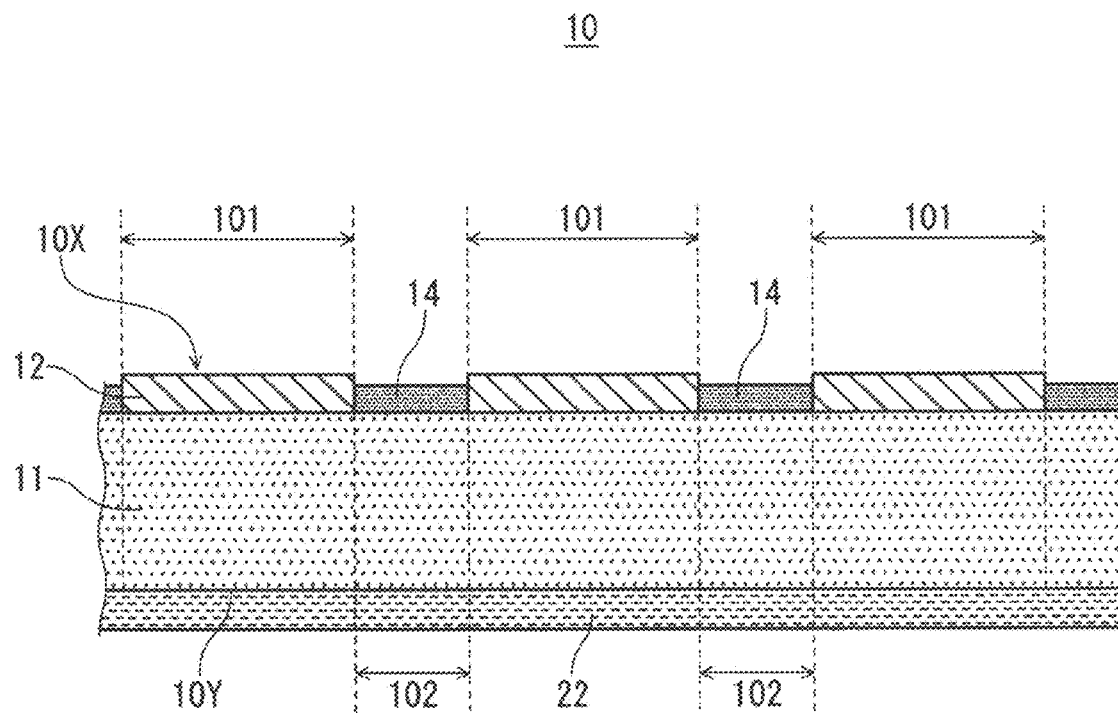
FIG. 12 is a schematic partial cross-sectional view of the substrate prepared by a preparation step according to an embodiment of the present invention.

FIG. 11 is a schematic top view of a substrate prepared by the preparation step according to the present embodiment. FIG. 12 is a schematic partial cross-sectional view of the substrate prepared by the preparation step according to the present embodiment.

A substrate 10 has a first surface 10X and a second surface 10Y, and includes a plurality of element regions 101 and a dicing region 102 defining the element regions 101. The element regions 101 include a semiconductor layer 11 and a wiring layer 12 laminated on the semiconductor layer 11 on the first surface 10X side. The dicing region 102 includes the semiconductor layer 11 and an electrically insulating film 14. The substrate 10 is attached at the second surface 10Y to a holding sheet 22 included in a conveying carrier 20.

(2) Resin Film Formation Step (S12)

This step forms a resin film that covers the first surface of the substrate.

The resin film is provided for protecting the element regions of the substrate from plasma exposure and the like. The resin film is removed after the smoothing step. The material, thickness, etc. of the resin film are as described above.

The resin film can be formed by, for example, forming a resist material into a sheet and attaching the sheet to the substrate, or by applying a liquid raw material of a resist material to the substrate using a spin-coating or spray-coating technique. By changing the amount of the liquid raw material while applying, the thickness of the resin film can be partially changed. Spin-coating and spray-coating may be used in combination, and thereby the coating amount may be adjusted.

Figure 13:
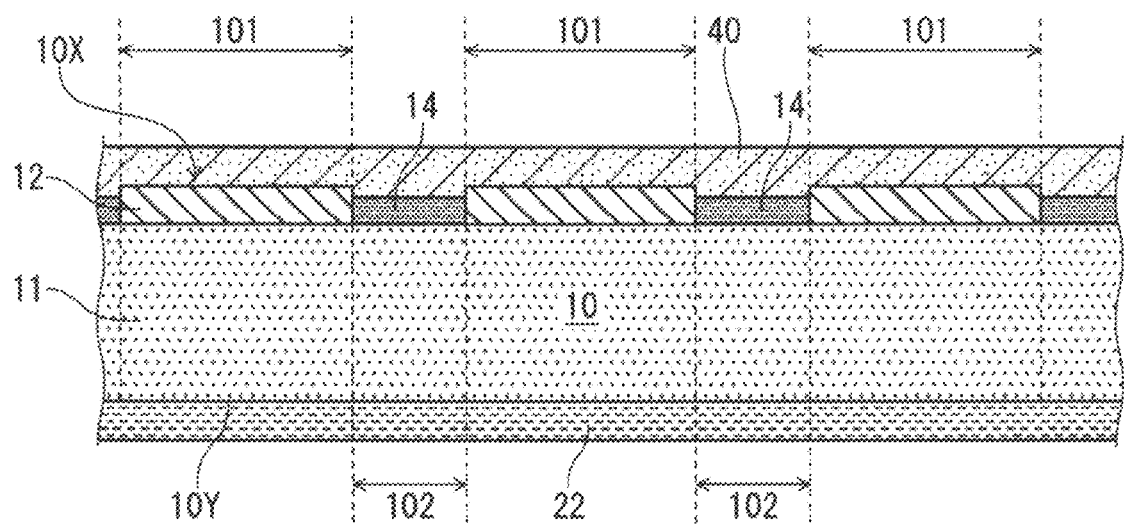
FIG. 13 is a schematic partial cross-sectional view of the substrate after a resin film formation step according to an embodiment of the present invention.

FIG. 13 is a schematic partial cross-sectional view of the substrate after the resin film formation step according to the present embodiment. On the first surface 10X of the substrate 10, the resin film 40 is formed.

(3) Opening Formation Step (S13)

This step forms an opening in the resin film, to expose the dicing region on the first surface.

The opening is formed by, for example, removing the resin film formed from a photoresist, along the dicing region by photolithography. The opening may be formed by removing the resin film made of a thermosetting resin or of a water-soluble resist, along the dicing region by laser-scribing patterning.

The opening may be formed by removing the resin film and the wiring layer along the dicing region. The removal of the wiring layer along the dicing region may be performed in a later-described plasma dicing step. In this case, the conditions for generating a plasma for removing the wiring layer can differ from those for etching the substrate.

After the opening formation step and before the plasma dicing step, the opening may be irradiated with a laser beam or plasma. This irradiation is performed for the purpose of, for example, reducing a residue caused by the opening formation step. This can improve the quality of plasma etching.

Figure 14:
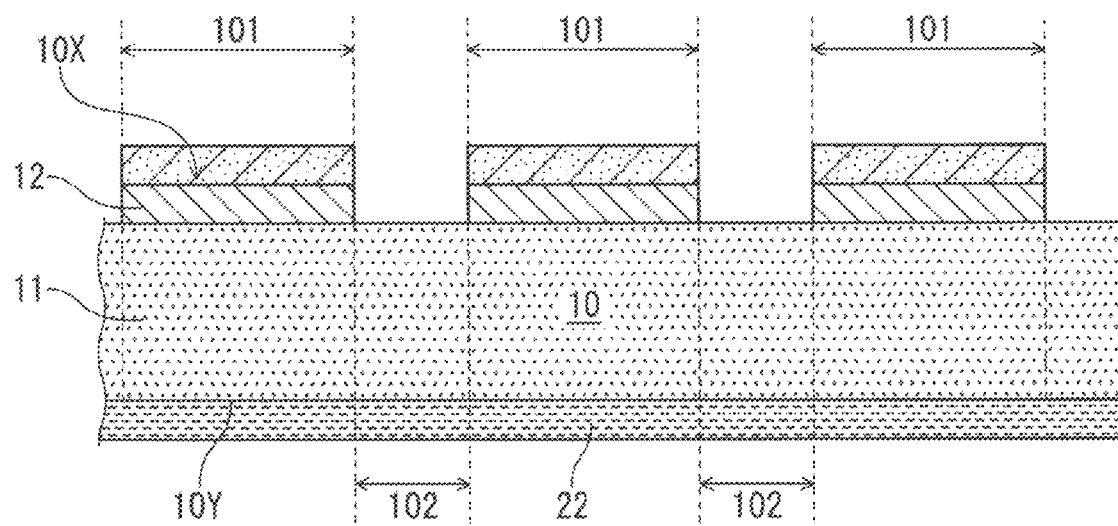
FIG. 14 is a schematic partial cross-sectional view of the substrate after an opening formation step according to an embodiment of the present invention.

FIG. 14 is a schematic partial cross-sectional view of the substrate after the opening formation step according to the present embodiment. The resin film 40 and the wiring layer 12 in the dicing region 102 are removed, and the semiconductor layer 11 is exposed from the opening along the divided region 102.

(4) Plasma Dicing Step (S14)

This step exposes the substrate to a plasma, to etch the dicing region exposed from the opening until etched to the second surface, thereby to form a plurality of element chips from the substrate. The plurality of the element chips are obtained in a state held on the holding sheet.

The plasma dicing is performed by a Bosch process. The Bosch process performs one or more cycles each consisting of an etching step of forming a groove along the dicing region and a deposition step of depositing a film on the inner wall of the groove. The above film (deposited film) removal step is performed between the etching step and the deposition step.

In the first cycle, a shallow groove is formed first along the dicing region by the etching step. This is followed by the deposition step, to deposit a film on the inner wall of the shallow groove. The second step begins with the deposited film removal step. The deposited film removal step is implemented by anisotropic etching. Specifically, of the film deposited on the inner wall of the groove, the film covering the bottom is removed. In the subsequent etching step, the bottom of the groove is etched isotropically. This is followed by the deposition step again, to deposit a film on the inner wall of the shallow groove. Repeating the second cycle (deposited film removal step, etching step, and deposition step) provides at least one element chip having a first surface covered with the resin film, a second surface, and a sidewall with scallops formed thereon.

The deposited film removal step is performed, for example, under the following conditions: while supplying $SF_6$ as a process gas at a rate of 200 sccm to 1000 sccm, the pressure in the vacuum chamber is adjusted to 5 Pa to 15 Pa, with the input power to the first electrode from the first high-frequency source set at 1500 W to 4800 W, and the input power to the second electrode from the second high-frequency power source set at 0 W to 1000 W; the processing time is 2 sec to 10 sec.

The etching step is performed, for example, under the following conditions: while supplying $SF_6$ as a process gas at a rate of 200 sccm to 1000 sccm, the pressure in the vacuum chamber is adjusted to 5 Pa to 15 Pa, with the input power to the first electrode from the first high-frequency source set at 1500 W to 4800 W, and the input power to the second electrode from the second high-frequency power source set at 10 W to 500 W; the processing time is 5 sec to 20 sec.

The deposition step is performed, for example, under the following conditions: while supplying $C_4F_8$ as a process gas at a rate of 150 sccm to 1000 sccm, the pressure in the vacuum chamber is adjusted to 10 Pa to 25 Pa, with the input power to the first electrode from the first high-frequency source set at 1500 W to 4800 W, and the input power to the second electrode from the second high-frequency power source set at 0 W to 50 W; the processing time is 2 sec to 15 sec.

By repeating the deposited film removal step, the etching step, and the deposition step under the conditions as above, the semiconductor layer containing Si can be etched vertically in the depth direction at a rate of 10 μm/min to 20 μm/min.

Figure 15:
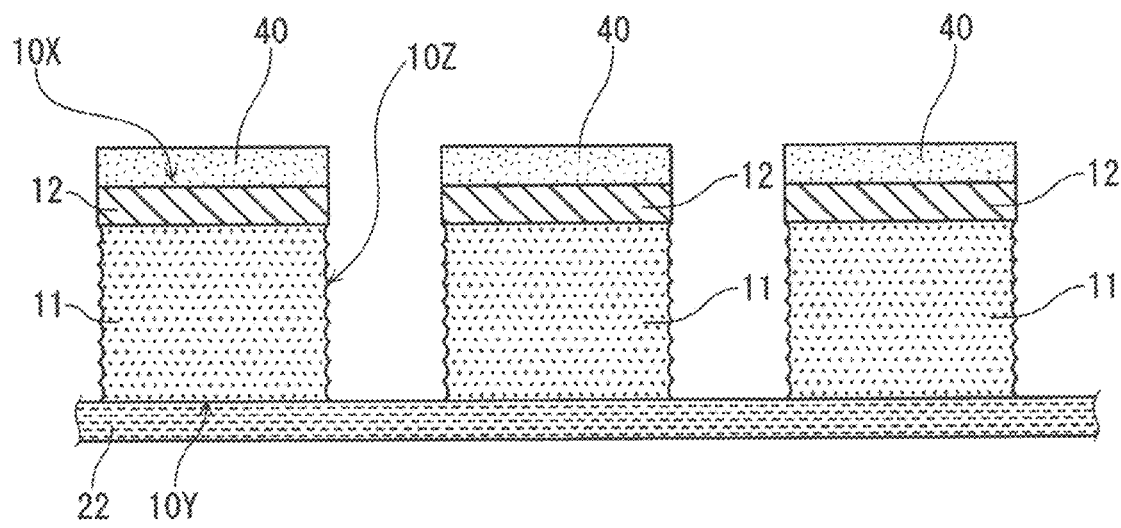
FIG. 15 is a schematic cross-sectional view of element chips produced by a plasma dicing step according to an embodiment of the present invention.

FIG. 15 is a schematic cross-sectional view of element chips produced in the plasma dicing step according to the present embodiment. The dicing region of the substrate is etched away, and a plurality of the element chips 200 are formed from the substrate. The sidewall 10Z of the element chips have scallops or ruggedness. The first surface 10X of the element chip 200 is covered with the resin film 40.

(5) Smoothing Step (S15)

This step reduces the ruggedness of the sidewall of the element chips.

The smoothing step is implemented through the above-described element chip smoothing method including the sidewall cleaning step (ii), the sidewall oxidation step (iii), and the sidewall etching step (iv). According to the smoothing method, the ruggedness can be reduced, with hardly causing side-etching.

(6) Resin Film Removal Step (S16)

The smoothing step may be followed by ashing which is performed in the plasma processing unit. This can remove the resin film. A process gas for ashing (e.g., oxygen gas ($O_2$), a mixed gas including $O_2$ gas and fluorine-containing gas) is introduced from an ashing gas source into the vacuum chamber. On the other hand, the vacuum chamber is evacuated with the decompression system, to maintain the vacuum chamber at a predetermined pressure. A high-frequency power is applied from the first high-frequency power source, to generate an oxygen plasma within the vacuum chamber, so that the resin film is removed from the surfaces of the individualized element chips which are exposed from the window of the cover.

Specifically, the ashing is performed, for example, under the following conditions: while supplying a mixed gas of $CF_4$ and $O_2$ (flow rate ratio $CF_4:O_2=1:10$) as an ashing gas at a rate of 150 sccm to 300 sccm, the pressure in the vacuum chamber is adjusted to 1 Pa to 15 Pa, with the input power to the first electrode from the first high-frequency power source set at 1500 W to 5000 W, the input power to the second electrode from the second high-frequency power source set at 0 W to 300 W. The input power to the second electrode in the ashing step is preferably set lower than that in the plasma dicing step.

When the protective film is water-soluble, the protective film may be removed by washing with water, instead of ashing.

Figure 16:
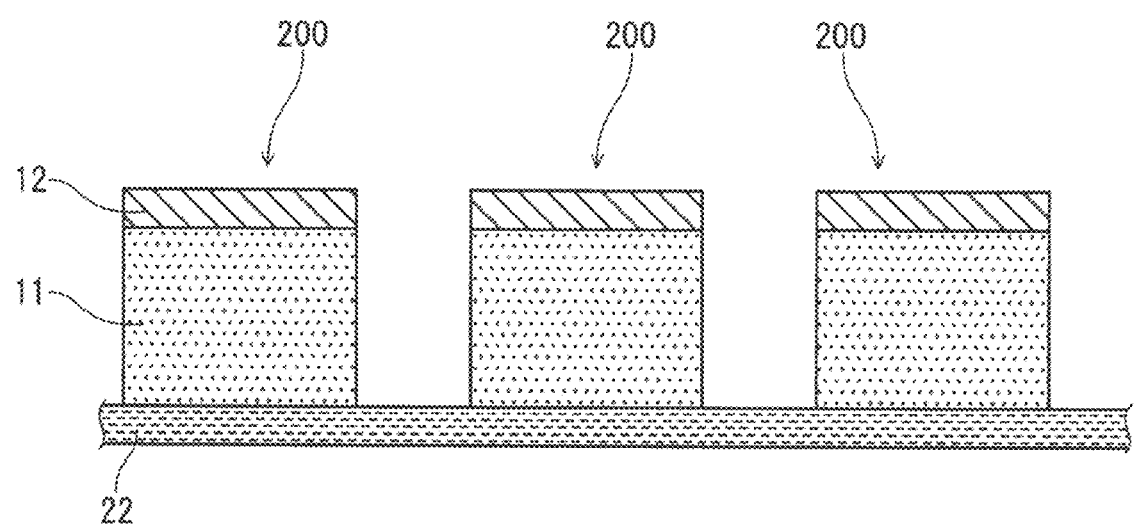
FIG. 16 is a schematic cross-sectional view of the element chips after a resin film removal step according to an embodiment of the present invention.

FIG. 16 is a schematic cross-sectional view of the element chips after the resin film removal step according to the present embodiment. The resin film 40 on the wiring layer 12 is removed.

After the resin film removal step, the element chips are detached from the holding sheet.

The element chips are, for example, pushed up together with the holding sheet by push-up pins from the non-adhesive side of the holding sheet. This causes at least part of the element chips to float up from the holding sheet. Then, the element chips are detached from the holding sheet by a pick-up unit.

The present invention will be specifically described below with reference to Examples. The present invention, however, is not limited to the following Examples.

Example 1

(1) Preparing Step, Resin Film Formation Step, and Opening Formation Step

A substrate having a semiconductor layer (thickness: approx. 90 µm) and a wiring layer (thickness: approx. 7 µm) was prepared. A resin film (thickness: approx. 17 µm, novolac resin) was formed on the wiring layer by a spin coating method. A laser beam was irradiated to the dicing regions from the resin film side, to remove the resin film and the wiring layer at the dicing regions.

(b) Plasma Dicing Step

Figure 17:
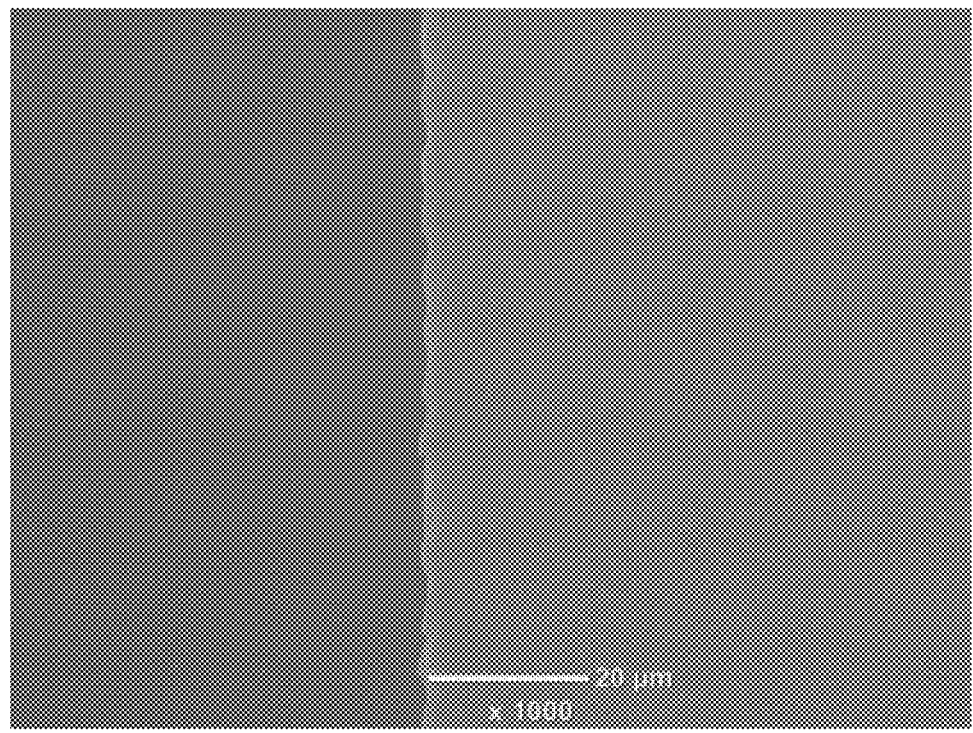
FIG. 17 is an SEM image (magnification 1000×) of a cross section of an essential part of an element chip obtained by plasma dicing in Example 1.

Subsequently, with the plasma processing apparatus of FIG. 4, the substrate was diced into element chips by a Bosch process. FIG. 17 is an SEM image (magnification 1000×) of a cross section of an essential part of an element chip thus produced. The vertical line near the middle shows the sidewall of the element chip, and the gray area on the right-hand side shows the cross section of the element chip. The image shows that ruggedness having a height of about 1 µm to 2 µm are formed on the sidewall.

In the Bosch process, the deposition step, the deposited film removal step, and the etching step were performed one after another, and this cycle was repeated 25 times in total.

In the deposition step, $C_4F_8$ was used as a process gas. $C_4F_8$ was supplied at a rate of 400 sccm. With the pressure in the vacuum chamber adjusted to 15 Pa, the input power to the first electrode set at 4800 W, and the input power to the second electrode set at 50 W, this step was performed for 3 sec.

In the deposed film removal step, $SF_6$ was used as a process gas. $SF_6$ was supplied at a rate of 600 sccm. With the pressure in the vacuum chamber adjusted to 20 Pa, the input power to the first electrode set at 4800 W, and the input power to the second electrode set at 200 W, this step was performed for 2 sec.

In the etching step, $SF_6$ was used as a process gas. $SF_6$ was supplied at a rate of 600 sccm. With the pressure in the vacuum chamber adjusted to 20 Pa, the input power to the first electrode set at 4800 W, and the input power to the second electrode set at 50 W, this step was performed for 5 sec.

(c) Smoothing Step
(c-1) Sidewall Cleaning Step

A smoothing step was performed in the same processing apparatus after the vacuum chamber was evacuated.

The substrate was exposed to a first plasma, thereby to remove deposits adhering to the sidewalls. $O_2$ and $CF_4$ were used in combination as a process gas. $O_2$ and $CF_4$ were supplied both at a rate of 100 sccm. The pressure in the vacuum chamber was adjusted to 5 Pa. With the input power to the first electrode set at 3500 W, and the input power to the second electrode set at 100 W, this step was performed for 120 sec. Thereafter, the vacuum chamber was evacuated.

(c-2) Sidewall Oxidation Step

Subsequently, the substrate was exposed to a second plasma, thereby to oxidize the surfaces of the sidewalls. $O_2$ was used as a process gas. $O_2$ was supplied at a rate of 150 sccm. The pressure in the vacuum chamber was adjusted to 5 Pa. With the input power to the first electrode was set at 2500 W, and the input power to the second electrode was set at 200 W, this step was performed for 60 sec. Thereafter, the vacuum chamber was evacuated.

(c-3) Sidewall Etching Step

Then, the substrate was exposed to a third plasma, thereby to etch the sidewalls. A mixed gas of $SF_6$ and $O_2$ was used as a process gas. $SF_6$ and $O_2$ were supplied both at a rate of 100 sccm. The pressure in the vacuum chamber was adjusted to 5 Pa. With the input power to the first electrode set at 2500 W, and the input power to the second electrode set at 150 W, this step was performed for 120 sec.

Figure 18:
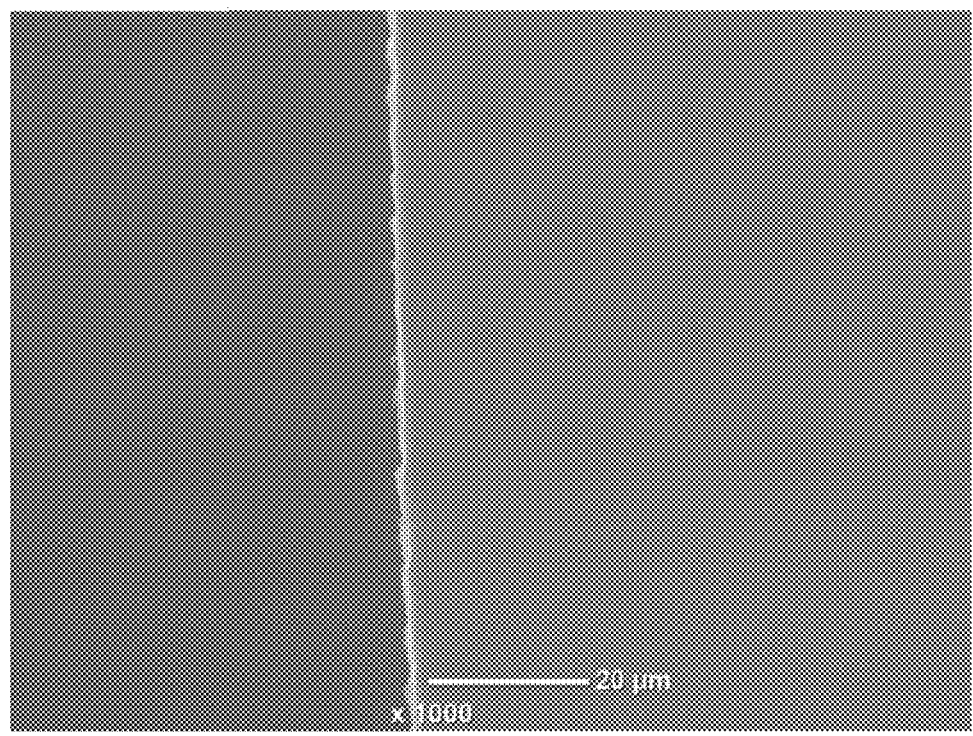
FIG. 18 is an SEM image (magnification 1000×) of a cross section of an essential part of the element chip after a smoothing step in Example 1.

FIG. 18 is an SEM image (magnification 1000×) of a cross section of an essential part of an element chip after the smoothing step. The vertical line near the middle shows the sidewall of the element chip, and the gray area on the right-hand side shows the cross section of the element chip. The image shows that the sidewall is nearly smooth, and has almost no shape abnormalities, such as side-etching and under-cut.

(d) Resin Film Removal Step

The resin film was dissolved and removed by washing with water.

The smoothing method of the present invention can reduce the ruggedness of the sidewall of the element chips while reducing side-etching, and therefore is particularly suitably applicable for post-processing of the element chips manufactured by a plasma dicing employing a Bosch process.

REFERENCE NUMERALS

10: substrate
  10X: first surface
  10Y: second surface
  10Z: sidewall
  11: semiconductor layer
    11a: oxide layer
  12: wiring layer
20: conveying carrier
  21: frame
    21a: notch
    21b: corner cut
  22: holding sheet
    22X: adhesive side
    22Y: non-adhesive side
40: resin film
60: deposits
100: plasma processing apparatus
  103: vacuum chamber
    103a: gas inlet
    103b: gas outlet
  108: dielectric member
  109: first electrode
  110A: first high-frequency power source
  110B: second high-frequency power source
  111: stage
  112: process gas source
  113: ashing gas source
  114: decompression system
  115: electrode layer
  116: metal layer
  117: base table
  118: peripheral member
  119: ESC electrode
  120: second electrode
  121: lifting rod
  122: support member
  123A, 123B: lifting system
  124: cover
    124W: window
  125: coolant circulator
  126: DC power source
  127: coolant channel
  128: controller
  129: circumferential ring
200: element chip

What is claimed is:

1. An element chip smoothing method comprising:
an element chip preparation step of preparing at least one element chip including a first surface covered with a resin film, a second surface opposite the first surface, and a sidewall connecting the first surface to the second surface and having ruggedness, and being held by a holding sheet, the holding sheet including a resin;
a sidewall cleaning step of exposing the element chip to a first plasma, to remove deposits adhering to the sidewall, with the resin film allowed to continue to exist;
a sidewall oxidation step of exposing the element chip to a second plasma, after the sidewall cleaning step, to oxidize a surface of the sidewall, with the resin film allowed to continue to exist; and
a sidewall etching step of exposing the element chip to a third plasma, after the sidewall oxidation step, to etch the sidewall, with the resin film allowed to continue to exist,
wherein the element chip is held by the holding sheet during the sidewall cleaning step, the sidewall oxidation step and the sidewall etching step,
wherein the sidewall cleaning step, the sidewall oxidation step and the sidewall etching step are performed using a plasma processing apparatus such that the holding sheet is cooled by setting the holding sheet on a cooled stage in a vacuum chamber of the plasma processing apparatus, wherein a pressure in the vacuum chamber during the sidewall etching step is 0.5 Pa or more and 30 Pa or less.

2. The element chip smoothing method of claim 1, wherein the sidewall oxidation step and the sidewall etching step are alternately repeated a plurality of times.

3. An element chip manufacturing method comprising:
a substrate preparation step of preparing a substrate including a plurality of element regions and a dicing region defining the element regions, the substrate having a first surface and a second surface opposite the first surface, the second surface being held by a holding sheet, the holding sheet including a resin;
a resin film formation step of forming a resin film that covers the first surface;
an opening formation step of forming an opening in the resin film, to expose the first surface along the dicing region;
a plasma dicing step of repeating a cycle including an etching step of forming a groove along the exposed dicing region and a deposition step of depositing a film on an inner wall of the groove, to dice the substrate into at least one element chip including the first surface covered with the resin film, the second surface, and a sidewall connecting the first surface to the second surface and having ruggedness;
a smoothing step of reducing the ruggedness of the sidewall; and
a resin film removal step of removing the resin film covering the first surface of the element chip, after the smoothing step,
the smoothing step including:
a sidewall cleaning step of exposing the element chip to a first plasma, to remove deposits adhering to the sidewall, with the resin film allowed to continue to exist;
a sidewall oxidation step of exposing the element chip to a second plasma, after the sidewall cleaning step, to oxidize a surface of the sidewall, with the resin film allowed to continue to exist; and
a sidewall etching step of exposing the element chip to a third plasma, after the sidewall oxidation step, to etch the sidewall, with the resin film allowed to continue to exist,
wherein the element chip is held by the holding sheet during the smoothing step,
wherein the sidewall cleaning step, the sidewall oxidation step and the sidewall etching step are performed using a plasma processing apparatus such that the holding sheet is cooled by setting the holding sheet on a cooled stage in a vacuum chamber of the plasma processing apparatus, wherein a pressure in the vacuum chamber during the sidewall etching step is 0.5 Pa or more and 30 Pa or less.

4. The element chip manufacturing method of claim 3, wherein the sidewall oxidation step and the sidewall etching step are alternately repeated a plurality of times.

* * * * *